(12) United States Patent
Liu et al.

(10) Patent No.: US 12,198,099 B2
(45) Date of Patent: Jan. 14, 2025

(54) BILL OF MATERIAL CONVERSION METHOD, ELECTRONIC APPARATUS AND NON-TRANSITORY COMPUTER-READABLE STORAGE MEDIUM

(71) Applicant: BOE TECHNOLOGY GROUP CO., LTD., Beijing (CN)

(72) Inventors: Tiantian Liu, Beijing (CN); Hong Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 518 days.

(21) Appl. No.: 17/036,152

(22) Filed: Sep. 29, 2020

(65) Prior Publication Data
US 2021/0125144 A1 Apr. 29, 2021

(30) Foreign Application Priority Data

Oct. 23, 2019 (CN) .......................... 201911011606.4

(51) Int. Cl.
*G06F 16/22* (2019.01)
*G06F 16/245* (2019.01)
(Continued)

(52) U.S. Cl.
CPC ..... *G06Q 10/0875* (2013.01); *G06F 16/2246* (2019.01); *G06F 16/245* (2019.01);
(Continued)

(58) Field of Classification Search
CPC .... G06Q 50/04; G06Q 10/0875; G06F 16/22; G06F 16/245; G06F 16/2246; G06F 16/258; G06F 10/103; G06F 30/10
See application file for complete search history.

(56) References Cited

U.S. PATENT DOCUMENTS 7,558,793 B1 * 7/2009 Topolovac ......... G06Q 10/0875
707/999.009
7,720,704 B2 * 5/2010 Lind ...................... G06Q 10/06
235/376
(Continued)

FOREIGN PATENT DOCUMENTS

CN 1444161 A 9/2003
CN 101458786 A 6/2009
(Continued)

OTHER PUBLICATIONS

China Patent Office, CN201911011606.4 First Office Action issued on Nov. 30, 2021.

*Primary Examiner* — Florian M Zeender
*Assistant Examiner* — Milena Racic
(74) *Attorney, Agent, or Firm* — HOUTTEMAN LAW LLC

(57) ABSTRACT

The present disclosure provides a bill of material conversion method, an electronic apparatus and a non-transitory computer-readable storage medium. A bill of material conversion method, including steps S1 to S4: Step S1: obtaining an unprocessed first node in a first bill of material; Step S2: according to a preset correspondence, creating a second node corresponding to a second bill of material according to the obtained first node, and storing the created second node into a list; Step S3: determining whether the first node currently obtained is a last first node of the first bill of material; in response to the first node currently obtained not the last first node of the first bill of material, repeatedly performing steps S1 through S3; in response to the first node currently obtained being the last first node, performing step S4: converting respective second nodes in the list into the second bill of material.

14 Claims, 6 Drawing Sheets

(51) Int. Cl.
*G06F 16/25* (2019.01)
*G06Q 10/0875* (2023.01)
*G06Q 10/10* (2023.01)
*G06Q 30/04* (2012.01)
*G06Q 50/04* (2012.01)
*G06F 30/10* (2020.01)

(52) U.S. Cl.
CPC ......... *G06F 16/258* (2019.01); *G06Q 10/103* (2013.01); *G06Q 30/04* (2013.01); *G06Q 50/04* (2013.01); *G06F 30/10* (2020.01)

(56) References Cited

U.S. PATENT DOCUMENTS

| | | | | |
|---|---|---|---|---|
| 7,810,025 B2 * | 10/2010 | Blair | ............... | G06Q 30/00 715/239 |
| 8,781,922 B2 * | 7/2014 | Shafiee | ............... | G06Q 10/06 705/29 |
| 9,002,691 B2 * | 4/2015 | Richards | ............... | G05B 17/02 703/7 |
| 9,250,796 B2 * | 2/2016 | Yahyavi | ............... | H04N 5/2621 |
| 9,652,495 B2 * | 5/2017 | Kaiser | ............... | G06F 16/245 |
| 10,048,679 B2 * | 8/2018 | DiPippo | ............... | G05B 19/41865 |
| 10,089,602 B2 * | 10/2018 | Kaiser | ............... | G06Q 10/0875 |
| 10,664,783 B2 * | 5/2020 | DiPippo | ............... | G06Q 10/06315 |
| 10,788,815 B2 * | 9/2020 | DiPippo | ............... | G06Q 10/0633 |
| 11,087,279 B2 * | 8/2021 | Vuppala | ............... | G06F 16/25 |
| 2003/0018628 A1 | 1/2003 | Luh | | |
| 2011/0161209 A1 | 6/2011 | Boyd et al. | | |
| 2011/0251975 A1 * | 10/2011 | Evans | ............... | G06Q 10/10 705/348 |
| 2013/0054427 A1 * | 2/2013 | Kageyama | ............... | G06Q 40/10 705/29 |
| 2020/0134560 A1 * | 4/2020 | McLinden | ............... | G06T 17/05 |
| 2020/0134745 A1 * | 4/2020 | McLinden | ............... | G06Q 10/06313 |

FOREIGN PATENT DOCUMENTS

| | | |
|---|---|---|
| CN | 101706820 A | 5/2010 |
| CN | 104346143 A | 2/2015 |
| CN | 106709700 A | 5/2017 |
| WO | WO 2009095981 A1 | 8/2009 |

\* cited by examiner

| number | material information | parent node information | deletion identifier |
|---|---|---|---|
| 1 | M1' | null | 0 |
| 2 | M2' | 1 | 0 |
| 3 | M3' | 2 | 0 |
| 4 | M4' | 3 | 0 |
| 5 | M5' | 2 | 0 |
| 6 | M6' | 1 | 0 |
| 7 | M7' | 6 | 0 |

List Lf converted into

Second BOM

BILL OF MATERIAL CONVERSION METHOD, ELECTRONIC APPARATUS AND NON-TRANSITORY COMPUTER-READABLE STORAGE MEDIUM

CROSS REFERENCE TO RELATED APPLICATIONS

The present application claims the priority of the Chinese Patent Application No. 201911011606.4 filed on Oct. 23, 2019, the content of which is incorporated herein by reference in its entirety.

TECHNICAL FIELD

The present disclosure belongs to the field of bill of material conversion technology, and particularly relates to a bill of material conversion method, an electronic apparatus and a non-transitory computer-readable storage medium.

BACKGROUND

A Bill of Material (BOM) is a document which is used to describe parts and materials of which a product is made, and also contains information, such as the number and a description of attributes of these parts and materials. In manufacturing industry, the BOM generally includes an engineering BOM (EBOM), a process BOM (PBOM), and a manufacturing BOM (MBOM). In production, engineers build a corresponding EBOM in a system according to a product design. After an examination for the EBOM is passed, a research and development personnel builds a corresponding MBOM in the system according to the EBOM, and a factory manufactures products according to the MBOM.

SUMMARY

The present disclosure provides a bill of material conversion method, an electronic apparatus and a non-transitory computer-readable storage medium.

In a first aspect, the present disclosure provides a bill of material conversion method, including steps S1 to S4:

Step S1: obtaining an unprocessed first node in a first bill of material;

Step S2: according to a preset correspondence, creating a second node corresponding to a second bill of material according to the obtained first node, and storing the created second node into a list;

Step S3: determining whether the first node currently obtained is a last first node of the first bill of material;

in response to the first node currently obtained not the last first node of the first bill of material, repeatedly performing steps S1 through S3;

in response to the first node currently obtained being the last first node of the first bill of material, performing step S4: converting respective second nodes in the list into the second bill of material.

In an embodiment of the present disclosure, the first bill of material and the second bill of material each have a tree structure.

In an embodiment of the present disclosure, the first nodes and the second nodes have a plurality of attribute information, including a number of a node, the step S2 includes:

according to the number of the obtained first node, searching a second node corresponding to the number of the first node in a second node library and creating the second node; and storing the created second node into the list.

In an embodiment of the present disclosure, the step S1 includes:

obtaining the unprocessed first node in the first bill of material by using a breadth first search algorithm and a depth first search algorithm.

In an embodiment of the present disclosure, the plurality of attribute information further includes material information, parent node information, and a deletion identifier of a node.

In an embodiment of the present disclosure, the step S4 includes:

circularly traversing each second node in the list, and sequentially obtaining parent node information of the second node;

determining whether the parent node information of the second node is null;

in response to the parent node information of the second node not null, stitching second nodes with same parent node information as nodes in a same layer, and connecting the second nodes with the same parent node information with a second node, associated with the parent node information, serving as a parent node of the nodes in the same layer;

in response to the parent node information of the second node being null, creating the second node as a root node of the second bill of material.

In an embodiment of the present disclosure, the method further includes:

performing a fast clipping on the second bill of material, by a user, wherein the fast clipping includes at least one of deleting a node, adding a node, and replacing a node;

the deleting a node includes:

determining a second node to be deleted, and setting the deletion identifier of the second node to be deleted as a first identifier;

changing the parent node information of all child nodes of the second node to be deleted to the parent node information of the second node to be deleted;

the adding a node includes:

determining a second node selected by the user;

searching a second node corresponding to material information in the second node library, according to the material information, which is input by the user, of the second node to be newly added, and creating the second node as the newly added node;

connecting the newly added node under the second node selected by the user, as a child node of the second node selected by the user;

the replacing a node includes:

determining an original second node to be replaced, which is selected by a user, and setting the deletion identifier of the original second node as the first identifier;

searching a second node corresponding to material information in the second node library, according to the material information of a target second node to be replaced, which is input by the user, and creating the second node as the target second node to be replaced;

setting the parent node information of the target node as the parent node information of the original second node.

In a second aspect, the present disclosure provides an electronic apparatus, including a processor and a memory for storing executable instructions; the processor is coupled to the memory through a communication bus, and is configured to read the executable instructions from the memory to cause the processor to implement the BOM conversion method according to any one of the embodiments of the first aspect.

In a third aspect, the present disclosure provides a non-transitory computer-readable storage medium having stored thereon computer-executable instructions, wherein the instructions, when executed by a processor, implement the BOM conversion method according to any one of the embodiments of the first aspect.

BRIEF DESCRIPTION OF DRAWINGS

Drawings, which are incorporated in and constitute a part of this specification, illustrate embodiments consistent with the present disclosure and, together with the description, serve to explain principles of the present disclosure.

DETAIL DESCRIPTION OF EMBODIMENTS

Figure 1:
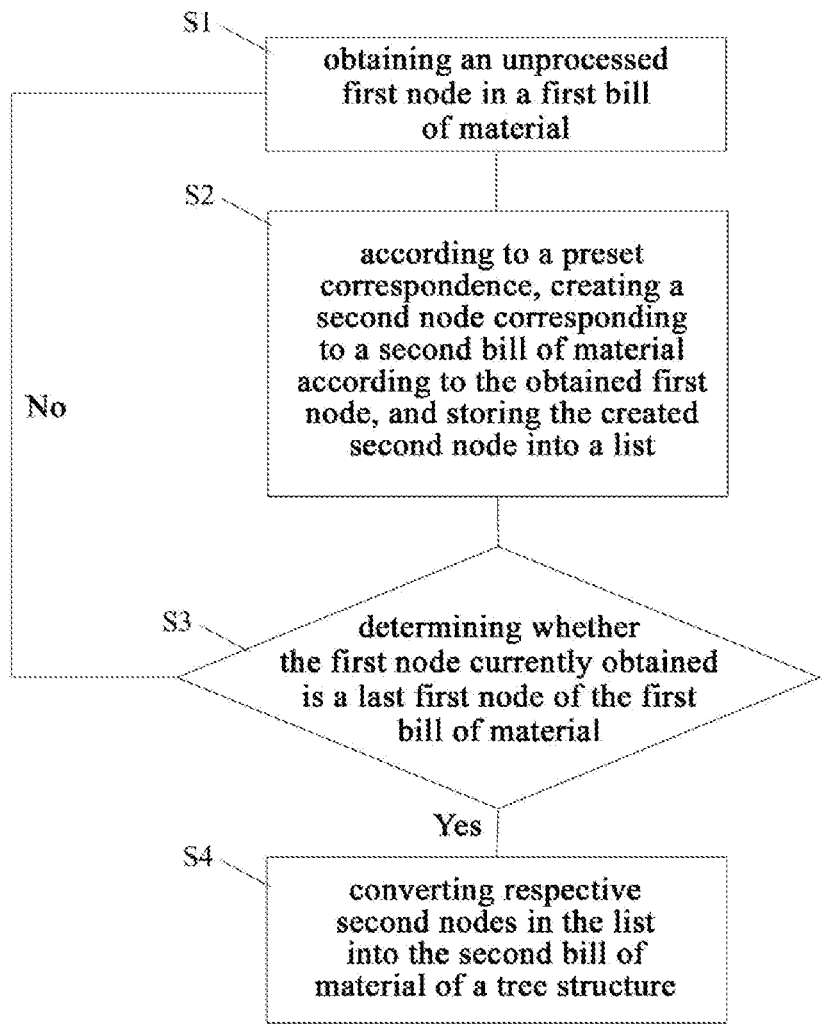
FIG. 1 is a flowchart of a bill of material conversion method according to an embodiment of the present disclosure.

To make objects, technical solutions and advantages of the present disclosure more apparent, the present disclosure will be described in further detail with reference to the drawings. It is apparent that the described embodiments are only some embodiments of the present disclosure, not all embodiments. All other embodiments, which may be obtained by one of ordinary skill in the art from the embodiments disclosed herein without any creative effort, shall fall within the protection scope of the present disclosure.

In the manufacturing industry, the BOM generally includes an engineering BOM (EBOM), a process BOM (PBOM), and a manufacturing BOM (MBOM). In production, engineers build a corresponding EBOM in a system according to a product design. After an examination for the EBOM is passed, a research and development personnel builds a corresponding MBOM in the system according to the EBOM, and a factory manufactures products according to the MBOM.

Because different factories are different in production lines, processing modes, processing sequences, materials and the like, MBOMs built according to the same EBOM may be different in different factories, and each factory needs to create its own MBOM. In the prior art, in an example in which the EBOM is converted into the MBOM, each material node in the EBOM needs to be manually checked, and then the material nodes in respective EBOMs are converted into the material nodes corresponding to the PBOM, to convert the EBOM into the MBOM. Generally, hundreds or thousands of material nodes exist in the EBOM, and a manual conversion for BOM needs a lot of time for repeated work, so that conversion efficiency is low.

The present disclosure provides a bill of material conversion method, which may convert a first bill of material into a second bill of material automatically, without a manual creation of target parts and without building a target bill of material, and may simultaneously generate the similar bill of material used by a plurality of factories, thereby saving the time required for converting different bills of material, improving the conversion efficiency.

Specifically, the present disclosure provides a bill of material conversion method, wherein first nodes in a first bill of material are sequentially obtained, and second nodes corresponding to a second bill of material are created according to the first nodes, according to a preset relationship; after all the second nodes are created, the second nodes are converted into the second bill of material with a tree structure, so that an automatic conversion of the first bill of material into the second bill of material may be achieved, saving time spent on conversion of different bills of material, and improving conversion efficiency of the bill of material.

The present disclosure is applicable to Computer Aided Design (CAD), Computer Aided Engineering (CAE), visualization and manufacturing systems, Product Data Management (PDM) systems, Product Lifecycle Management (PLM) systems, and similar systems, which are used to create, use, and manage data for products and other projects (referred to herein collectively as product systems). Examples of PLM systems that may be adapted to the BOM conversion method described below may include active workspace features of PLM application software, NX application suite, Solid Edge, and/or LMS Imagine.LAB application.

Specifically, the PLM system may include modules, such as a structure management module, a workflow and process management module, a user management module, and a change management module, where the structure management module may manage a plurality of materials in the BOM, the materials may be, for example, first nodes and second nodes described below in this disclosure. When the BOM conversion is needed, a user firstly imports a first BOM into application software of the PLM system, and then manages a plurality of first nodes by using the structure management module. Similarly, after the first BOM is converted into the second BOM, the plurality of second nodes may be managed by the structure management module. However, it should be understood that the systems and methods described herein may be used in other product systems (e.g., PLM, PDM systems) and/or in any other type of system for generating and storing product data in a database. Additionally, examples of databases that may be used as one or more data storage described herein include database server applications (such as Oracle, Microsoft SQL server) or any other type of data storage that operates to store data records. A storage description table for material attributes (taking the second BOM as the finished BOM as an example) is as follows:

| Attribute name | Attribute description | Attribute value |
| --- | --- | --- |
| object_name | Material name | XX_XXX_XXX_XXX |
| object_desc | Material description | XX_XXX_XXX_XXXXX |
| object_type | Material type | XX_XXXXXX-XX |
| item_id | Material ID | MN00010101-S01 |
| ics_classified | Whether or not to classify | YES |
| owning_user | Owner | PLMAdmin4 (plmadmin4) |
| owning_group | Group | dba |
| last_mode_user | The last user to change | PLMAdmin4 (plmadmin4) |
| t4_part_matgroup | Material product group | BF001 |
| t4_product_type | Product group | 01 |
| t4_part_type | Material group | FERT |
| uom_tag | Material unit | PC |
| t4_basic_quantity | Basic unit | 1 |
| t4_customer_code | Customer code | 13058 |
| t4_customer_model | Customer material | XX-XXXX-XX |
| t4_single_gross_weight | Gross weight | 5800 |
| t4_single_net_weight | Net weight | 4400 |
| t4_volume | Volume | 46911.928 |
| revision_list | Version list | Material version (relationship attribute) |
| bom_view_tags | BOM | BOM code (relationship attribute) |
| IMAN_master_form | IMAN form | Form (relationship attribute) |
| Creation_date | Creation date | 2018 Oct. 29 20:09 |
| Creation | Creator | Kobe |

The conversation of the first nodes corresponding to the first BOM into the second nodes corresponding to the second BOM, is substantially the conversation of materials corresponding to the first BOM into materials corresponding to the second BOM, and types of materials corresponding to the first BOM are different from types of materials corresponding to the second BOM. Therefore, the conversion of the materials corresponding to the first BOM into the materials corresponding to the second BOM is the conversion of types of materials. Taking the finished products in the above table as examples, and taking the first BOM as the engineering BOM and the second BOM as the manufacturing BOM as examples, the type of the engineering finished product corresponding to the engineering BOM is: T4_SFGCode-D, the type of the manufacturing finished product corresponding to the manufacturing BOM is: T4_SFGCode-M. When the manufacturing BOM is created, a finished product material (namely a second node) with the material type of T4_SFGCode-M is created, then attributes of all materials (namely first nodes) of the engineering finished product are traversed (searched), and attribute information is given to attribute information of materials corresponding to the manufacturing finished product. It should be noted that the material attribute (i.e., the attribute information described below) of each type of material is defined by basic data types in the database. In the material attributes (i.e., the attribute information described below), material codes, material types, creators, and creation times of the first nodes and the second nodes are different. Other attribute information needs to be consistent with the engineering materials. For relationship attribute information, a corresponding form, associated materials and the like need to be created, which, specifically, may be set as needed, and is not limited herein.

Shapes and sizes of the components in the drawings are not drawn to scale, but are merely intended to facilitate an understanding of contents of the embodiments of the present disclosure.

FIG. 1 is a flowchart of an embodiment of a method for converting bills of material according to an embodiment of the present disclosure. In a first aspect of the present disclosure, as shown in FIG. 1, the present embodiment provides a Bill of Material (BOM) conversion method, including the following steps S1 to S4:

S1, obtaining an unprocessed first node in a first BOM.

Optionally, the first BOM has a plurality of first nodes therein. The plurality of first nodes may be arranged out of order, or may be arranged in a certain order, which is not limited herein. The unprocessed first node is a first node which has not been accessed in the plurality of first nodes of the first BOM. When the first BOM is converted to the second BOM, the first nodes which have not been accessed (i.e., unprocessed first nodes) are sequentially obtained in a certain order for processing, so as to convert the first nodes to second nodes corresponding to the second BOM.

In particular, the first nodes may be a plurality of types of materials corresponding to the first BOM. Taking the first BOM as the engineering BOM as an example, the first node may be a structure obtained by splitting a product from a design perspective, which exhibits respective components, materials, raw materials, finished products or semi-finished products and the like constituting the product, which, specifically, may be adjusted according to the type and use of the first BOM, which is not limited herein.

Optionally, each first node may have a plurality of attribute information, and the plurality of attribute information includes a number (also referred to as a material number) of each first node. By searching for the material number (number), the corresponding material (first node) may be found. Taking the first BOM as an engineering BOM as an example, the attribute information of the first node may further include a name, a figure number, a specification, a net weight, a configuration relationship, and the like of the first node. The specific attribute information of the first node may be set as needed, which is not limited herein.

Specifically, in S1, the step of obtaining an unprocessed first node in the first BOM includes a step of obtaining attribute information of the first node, for example, a number of the first node.

Optionally, the first BOM has a plurality of first nodes, and the plurality of first nodes may be stored as the first BOM in a list form. Alternatively, the plurality of first nodes may also be stored as the first BOM of the tree structure, which, specifically, may be designed as needed, and is not limited herein. An example in which the first BOM is a tree structure will be described below.

Optionally, if the first BOM is the tree structure, the unprocessed first node in the first BOM may be obtained by using a traversal (search) algorithm, wherein the traversal algorithm used may be various types of traversal algorithms, such as a breadth first search (BFS) algorithm and a depth first search (DFS) algorithm. When traversing the tree structure of the first BOM, the BFS preferentially selects the first node in a same layer as a recently obtained first node in the first nodes which are not accessed for processing; and when traversing the tree structure of the first BOM, the DFS preferentially selects a sub first node of a recently obtained (last obtained) first node in the first nodes which are not accessed for processing, and selects the first node in a same layer as the recently obtained first node for processing, if there is no sub node of the recently obtained first node.

In this embodiment, the depth first search (DFS) algorithm is taken as an example for explanation.

Specifically, in S1, it is first determined whether the obtained first node has been assessed. If the obtained first node has not been assessed, the first node is selected as the first node obtained this time, that is, the first node that has not been processed; and if the obtained first node is accessed, a next first node is preferentially selected in the first BOM of the tree structure in depth. Above steps are repeated until there is no unprocessed first node in the first BOM any more.

The first node in the first BOM is obtained by using the depth first search algorithm, so that a speed of traversing the first BOM may be increased, and system resources used for traversing the first BOM may be saved.

It should be noted that the first BOM is a source BOM to be converted, which may be various types of BOMs, for example, an engineering BOM (EBOM), a process BOM (PBOM), etc., which, specifically, may be selected according to needs, and is not limited herein. The following description will take the first BOM as the engineering BOM as an example.

S2, according to a preset correspondence, creating a second node corresponding to a second BOM according to the obtained first node, and storing the created second node into a list.

It should be noted that the second BOM is a target BOM converted from the first BOM, and may be any type of BOM, for example, a process BOM, a manufacturing BOM (MBOM), and the like, which, specifically, may be selected according to needs, and is not limited herein. The following description will take the second BOM as the manufacturing BOM as an example.

Figure 2:
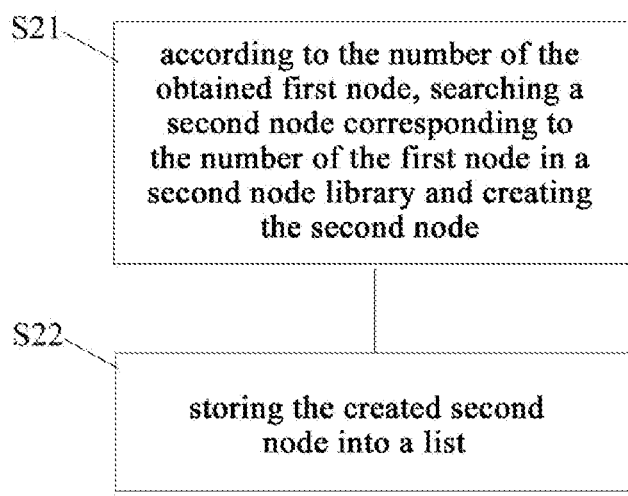
FIG. 2 is a detailed flowchart of step S2 in the bill of material conversion method according to an embodiment of the present disclosure.

FIG. 2 is a detailed flowchart of step S2 in the method for converting bills of material according to the embodiment of the present disclosure. Specifically, as shown in FIG. 2, the step S2 may include the following steps S21 and S22:

S21, according to the number of the obtained first node, searching a second node corresponding to the number of the first node in a second node library and creating the second node.

Optionally, each second node may have a plurality of attribute information, and the plurality of attribute information includes a number (also referred to as a material number) of each second node. By searching for the material number (number), the corresponding material (second node) may be found. Taking the second BOM as the manufacturing BOM as an example, the attribute information of the second node may further include a demand time fence, a planning time fence, an order policy, a lot identifier, a planner, an order number, a production lead time, and the like of the second node. The specific attribute information of the second node may be set as needed, and is not limited herein.

Specifically, the number (i.e., the material number) of each of second nodes, and the correspondence between the number and the second node are stored in the database in advance. A set of the number of each of second nodes and the correspondence between the number and the second node in the database is called as a second node library. In S1, an unprocessed first node in the first BOM is obtained, a number of a second node that is the same as a number of the first node is searched in the second node library according to the number in the attribute information of the first node, and the second node corresponding to the number is obtained according to a correspondence between the number of the second node and the second node, to create the second node.

Further, the second nodes may specifically be a plurality of types of materials corresponding to the second BOM. Taking the second BOM as the manufacturing BOM as an example, the second node may be a structure obtained by splitting a product from a manufacturing perspective based on an engineering BOM, which exhibits respective components required for constituting the product and a process flow for forming the component. The component may include components, materials, raw materials, finished products or semi-finished products, and the like, and may be specifically adjusted according to the type and use of the second BOM, which is not limited herein.

It should be noted that, because different factories are different in production lines, processing modes, processing sequences, materials and the like, specific types of the second nodes in the second BOM may differ in different factories. Therefore, before the step S1, it is necessary to determine a factory selected by the user, and then convert the first BOM into the second BOM according to the second node library corresponding to the factory selected by the user.

S22, storing the created second nodes into a list.

Specifically, a list is created in the database, and corresponding second nodes created according to the first nodes are sequentially stored in the list. After traversing the first BOM, namely, converting all first nodes in the first BOM into second nodes and storing the second nodes in the list, the list is the second BOM in a list form.

Optionally, each of the second nodes in the list may include a plurality of attribute information. After the second node is created according to the first node, the attribute information of the second node are added in the second node. Taking the first BOM of the tree structure as an example, the second BOM composed of corresponding second nodes created according to first nodes in the first BOM is also of the tree structure, and the attribute information of the second node may include a number, parent node information, and a deletion identifier of the second node. The parent node information of the second node may be obtained according to a node position of the first node in the first BOM of the tree structure, facilitating the combination (stitching) of the second nodes in the list into the second BOM of the tree structure. The deletion identifier of the second node is used to indicate whether the second node is to be deleted, and includes a first identifier (e.g., an identifier 0) and a second identifier (e.g., an identifier 1). The first identifier and the second identifier may be any two values that are different. The specific numerical values of the first identifier and the second identifier may be set as needed, which is not limited herein. In the embodiment of the present disclosure, the first identifier is taken as identifier 0, and the second identifier is taken as identifier 1 for example.

If the deletion identifier of the second node is the identifier 0, the second node is not deleted; and if the deletion identifier of the second node is the identifier 1, the second node is deleted. Default deletion identifiers of the second nodes are all set to identifiers 0 (i.e., the second nodes are not deleted).

The attribute information of the second node may further include material information of the second node. The material information may be, for example, a demand time fence, a planning time fence, an order policy, a lot identifier, a planner, an order number, and a production lead time of the second node.

S3, determining whether a currently obtained first node is the last first node of the first BOM, that is, determining whether there is an unprocessed first node in the first BOM.

If the currently obtained first node is not the last first node in the first BOM, one of the unprocessed first nodes in the first BOM is obtained, and the above steps (S1 to S3) are repeated. Specifically, one of the unprocessed first nodes may be randomly selected, or one of the unprocessed first nodes may be selected according to an arrangement order of the first nodes or according to an algorithm for traversing the first nodes. For example, if the depth first search algorithm is adopted to obtain the first node in the first BOM in this embodiment, a child node of the first node that is processed last time is selected as the first node obtained this time for processing, which, specifically, may be set as needed, which is not limited herein.

If the currently obtained first node is the last first node in the first BOM, S4 is performed.

S4, converting respective second nodes in the list into the second BOM of the tree structure.

By converting respective second nodes into the second BOM of the tree structure, a user may conveniently and intuitively know the structure of the second BOM and the relationship among the second nodes.

Figure 3:
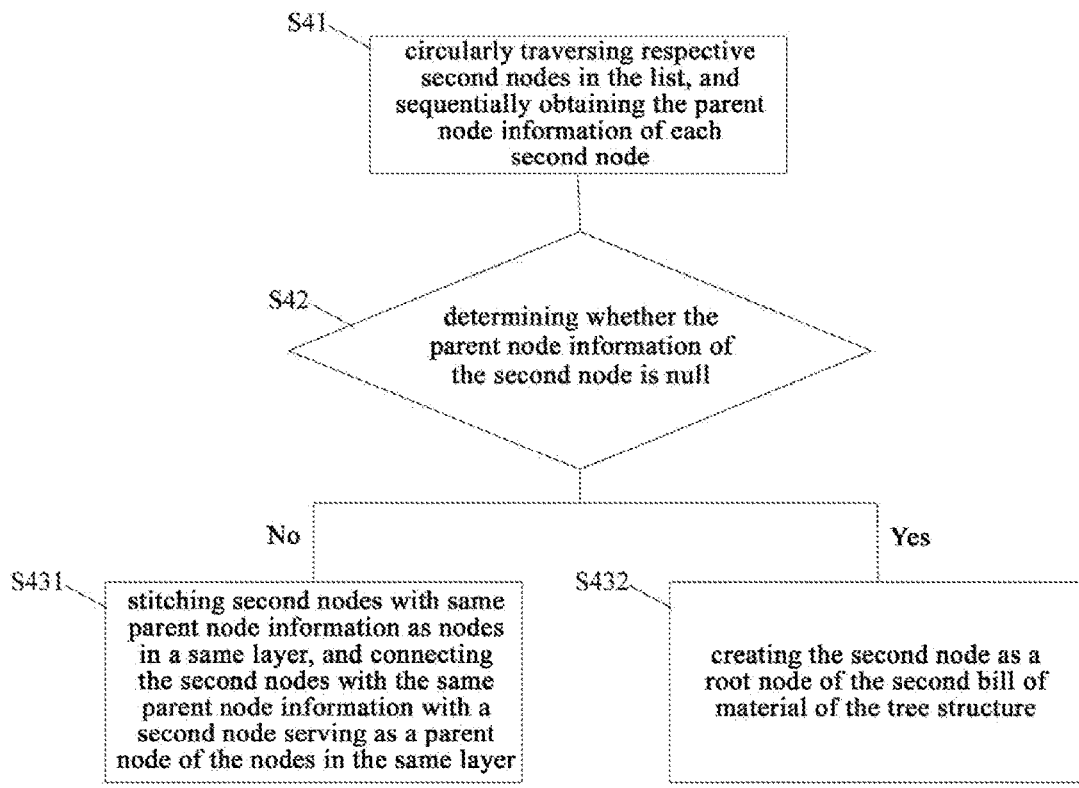
FIG. 3 is a detailed flowchart of step S4 in the bill of material conversion method according to an embodiment of the present disclosure.

FIG. 3 is a detailed flowchart of step S4 in the method for converting bills of material according to the embodiment of the present disclosure. Specifically, referring to FIG. 3, the step S4 may include the following steps S41, S42, S431, and S432:

S41, circularly traversing respective second nodes in the list, and sequentially obtaining the parent node information of each second node.

In the embodiment of the present disclosure, one second node in the list is obtained, and the parent node information of the second node is obtained, so as to perform a determination in S42; and performing S431 or S432 according to a determination result, to find a node position of the second node in the second BOM of the tree structure. After the node position of the second node is found, it performs a determination of whether the second node is the last second node in the list. If the second node is the last second node in the list, circularly traversing the second BOM is finished. That is, it is completed that the second nodes in the list are converted into the second BOM of the tree structure. If the second node is not the last second node in the list, a next second node in the list is obtained, and S42 is performed.

S42, determining whether the parent node information of the second node is null.

If the parent node information of the second node is not null, S431 is performed.

S431, stitching second nodes with same parent node information as nodes in a same layer, and connecting the second nodes with the same parent node information with the second node, associated with the parent node information, serving as a parent node of the nodes in the layer.

Specifically, if the parent node information of different second nodes is the same (which indicates that the second nodes are lower-layer nodes of the same parent node, and the second nodes are nodes in a same layer), the second nodes are stitched as nodes in a same layer and connected with the second node serving as a parent node of the nodes in the layer, to serve as a sub-tree of the tree structure. The plurality of second nodes are stitched according to the above manner, such that the plurality of second nodes may be converted into the second BOM of the tree structure.

If the parent node information of the second node is null, S432 is performed.

S432, creating the second node as a root node of a second bill of material of the tree structure.

Specifically, if the parent node information of the second node is null (which indicates that the second node has no parent node, that is, the second node is an ancestor node of other second nodes), the second node is stitched to the uppermost layer of the tree structure and serves as a root node in the second BOM of the tree structure. The following examples are given.

Figure 4:
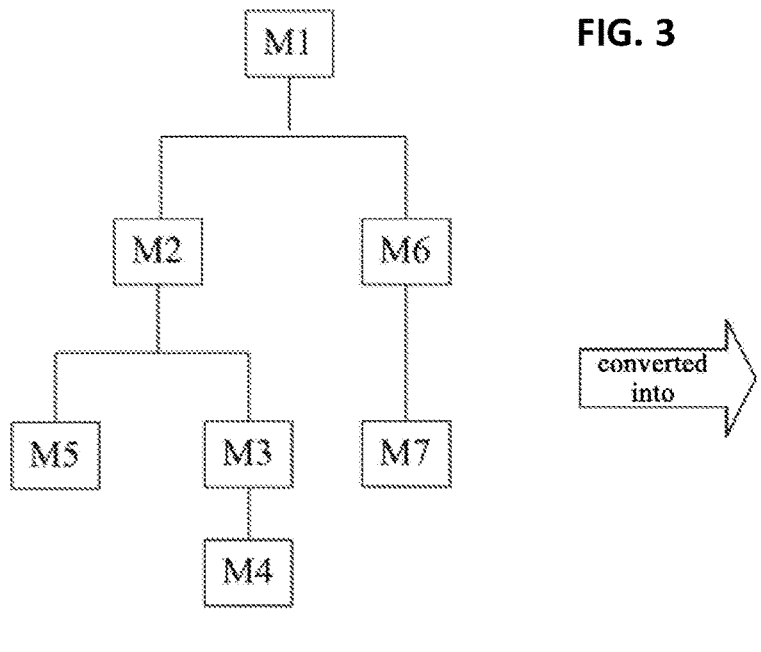
FIG. 4 is a schematic diagram of converting a first BOM into a list of second nodes in the bill of material conversion method according to an embodiment of the present disclosure.

FIG. 4 is a schematic diagram of converting a first BOM into a list of second nodes in the bill of material conversion method according to the embodiment of the present disclosure. Referring to FIG. 4, it is assumed that the first BOM has the tree structure and includes 7 first nodes, denoted as M1 to M7, respectively, where M1 is a root node of the first BOM, so that its parent node information is null; M2 and M6 are nodes in a same layer, and M5, M3 and M7 are nodes in a same layer; M2 and M6 are lower-layer nodes of M1, that is, a parent node of M2 and M6 is M1, so the parent node information of M2 and M6 is the number 1 of M1; M7 is a lower-layer node of M6, that is, the parent node of M7 is M6, so the parent node information of M7 is number 6 of M6; M5 and M3 are lower-layer nodes of M2, that is, a parent node of M5 and M3 are M2, so the parent node information of M5 and M3 is number 2 of M2; M4 is a lower-layer of M3, that is, a parent node of M4 is M3, so the parent node information of M4 is number 3 of M3. Taking obtaining a first node in a first BOM by adopting a depth first search algorithm as an example, after obtaining the first node in an order of M1-M2-M3-M4-M5-M6-M7, according to the number of M1, a second node having a same number as that of M1 is searched in a second node library, and is created as a second node M1', and material information and parent node information (null) of M1 are correspondingly stored as material information and parent node information (null) of M1', respectively, and a deletion identifier of M1' is set as identifier 0 . . . . . . , and so on. The 7 first nodes may be converted into 7 second nodes, where the 7 second nodes are denoted as M1' to M7', and the second nodes M1' to M7' and their corresponding numbers, material information, parent node information, and deletion identifiers are stored in the list Lf.

Figure 5:
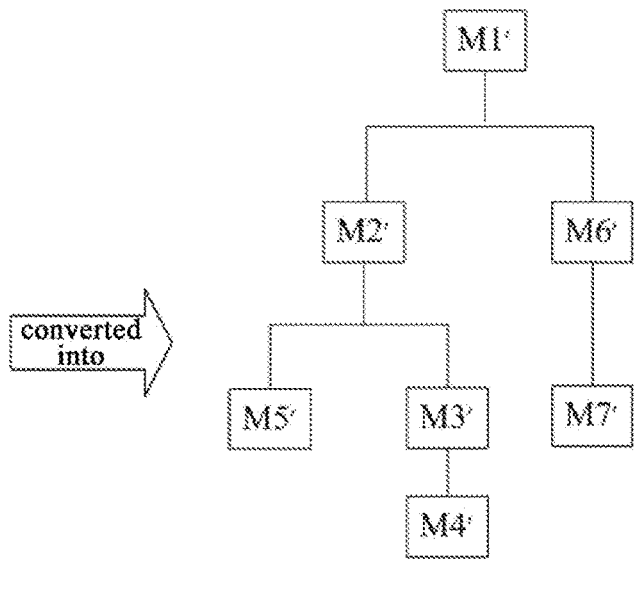
FIG. 5 is a schematic diagram of converting second nodes into a second BOM of a tree structure in the bill of material conversion method according to an embodiment of the present disclosure.

FIG. 5 is a schematic diagram of converting second nodes into a second BOM of a tree structure in the bill of material conversion method according to the embodiment of the present disclosure. According to the second nodes M1' to M7' and corresponding numbers, material information, parent node information and deletion identifications thereof stored in the list Lf, the stored second nodes M1' to M7' are converted into a second BOM corresponding to the first BOM for display. Specifically, referring to FIG. 5, after all the first nodes in the first BOM are converted into the second nodes to obtain the list Lf, the second nodes in the list are converted into the second BOM of the tree structure. The list Lf is circularly traversed, thereby sequentially obtaining a second node and parent node information thereof. M1' is set as a root node of the tree structure since the parent node information of M1' is null; since the parent node information of M2' and M6' are both 1, M2' and M6' are stitched into a same layer as nodes in a same layer, and are connected with M1'; since the parent node information of M3' and M5' are 2, M3' and M5' are stitched into a same layer as nodes in a same layer, and are connected with M2'; since the parent node information of M7' is 6, M7' is stitched as a lower-layer node of M6', and is connected with M6'; since the parent node information of M4' is 3, M4' is stitched as a lower-layer node of M3', and is connected with M3'. After the circulating traversal is completed, the second nodes M1' to M7' in the list are stitched into the second BOM of the tree structure for presentation to the user. In embodiments of the present disclosure, a structure of the second BOM is known, which corresponds to a structure of the first BOM.

In the BOM conversion method according to embodiments of the present disclosure, the first nodes in a first bill of material are sequentially obtained, and second nodes corresponding to a second bill of material are created according to the first nodes, according to a preset relationship; after all the second nodes are created, the second nodes are converted into the second bill of material of the tree structure, so that an automatic conversion of the first bill of material into the second bill of material may be achieved, saving time spent on conversion of different bills of material, and improving conversion efficiency of the bill of material.

Optionally, after step S4, the method may further include step S5:

S5, performing a fast clipping on the second bill of material of the tree structure, by a user, wherein the fast clipping may include a plurality of operations on the nodes, and for example, the fast clipping may include at least one of operations of deleting the node(s), adding the node(s), and replacing the node(s).

Figure 6:
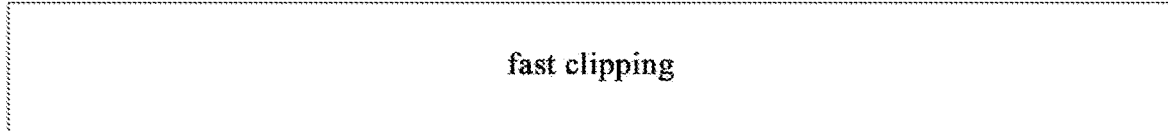
FIG. 6 is a schematic diagram of a graphical interface for fast clipping in the bill of material conversion method according to an embodiment of the present disclosure.
Figure 6:
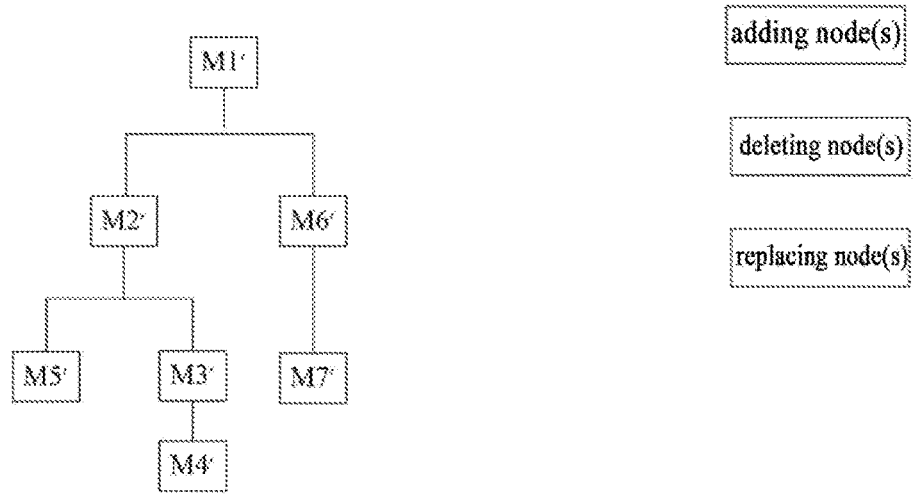

FIG. 6 is a schematic diagram of a graphical interface for fast clipping in a bill of material conversion method according to an embodiment of the present disclosure. As shown in FIG. 6, if the BOM conversion method according to an embodiment of the present disclosure is applied in software, the second BOM of the tree structure may be displayed to a user on a graphical display interface, and a variety of operation buttons may be added to the graphical display interface. In this embodiment, the fast clipping includes deleting, adding, and replacing node(s), for example, a deleting button corresponding to the deleting node(s), an adding button corresponding to the adding node(s), and a replacing button corresponding to the replacing node(s). The user may rapidly clip the second BOM of the tree structure by clicking different operation buttons, so that the user may revise the second BOM as needed.

Figure 7:
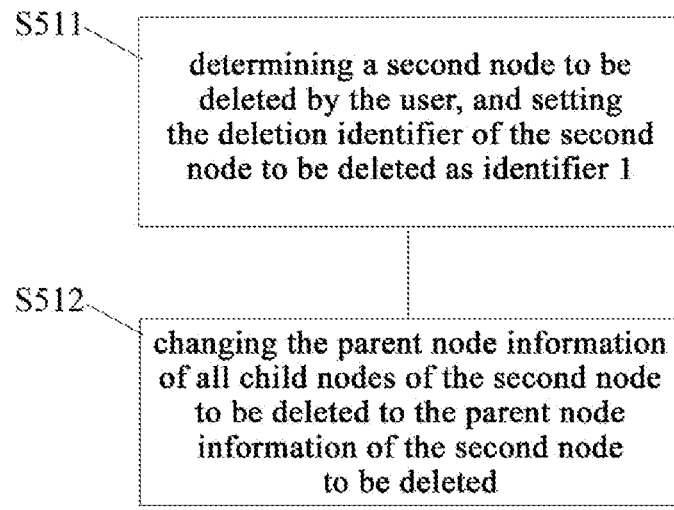
FIG. 7 is a flowchart of deleting node(s) in the bill of material conversion method according to an embodiment of the present disclosure.

FIG. 7 is a flowchart of deleting node(s) in the method for converting bills of material according to the embodiment of the present disclosure. Optionally, referring to FIG. 7, deleting the node(s) may specifically include the following steps S511 and S512:

S511, determining one or more second nodes to be deleted by the user, and setting the deletion identifiers of the second nodes to be deleted as identifier 1.

Specifically, the user may select one or more second nodes that the user wants to delete, obtain the numbers of the one or more second nodes selected by the user, and set the deletion identifiers of the corresponding second nodes to identifier 1 according to the numbers.

The deletion identifier is used to indicate whether to delete the node. As may be seen from the foregoing, if the deletion identifier of the second node is identifier 0, the node is not deleted, and if the deletion identifier of the second node is identifier 1, the node is deleted. The identifier 0 and the identifier 1 may be any and different two values, and specific values may be set as needed, which is not limited herein.

S512, changing the parent node information of all child nodes of the second node to be deleted to the parent node information of the second node to be deleted.

Specifically, if a second node is deleted, the parent node information of all the child nodes under the second node may be changed to the parent node information of the deleted second node, and the parent node of the deleted second node replaces the deleted second node, as a new parent node of lower-layer second nodes of the deleted second node.

In an embodiment of the present disclosure, the undeleted second nodes are still displayed, and the deleted second node is not displayed. For the deleted second node, the value of the deletion identifier of the deleted second node is only changed, and other attribute information of the deleted second node are not changed; and if the undeleted second nodes are child nodes of the deleted second node, the parent node information thereof is changed correspondingly, and other attribute information are not changed. The changed attribute information of the second nodes are updated in the list. Note that the deleted second node and corresponding information are simply not displayed, but are still stored in the list.

For example, as shown in FIG. 5, the parent node of the second node M2' is the second node M1', the child nodes are the second node M3' and the second node M5', and the child node of the second node M3' is the second node M4', and the second node M5' does not have the child node. In the embodiment of the present disclosure, when the second node M2' is deleted, the parent nodes of its child nodes M3' and M5' become the second node M1', and thus the parent node information of the second node M3' and the second node M5' becomes the number 1 of the second node M1', while the other attribute information of the second node M3' and the second node M5' are not changed. The parent node of the second node M4' is still the second node M3'. Therefore, the respective attribute information of the second node M4' are not changed. And the respective attribute information of the second node M1' are also not changed. The deletion identifier of the deleted second node M2' becomes identifier 1, and the other attribute information of the deleted second node M2' are not changed and remains stored in the list, without being displayed to the user.

Figure 8:
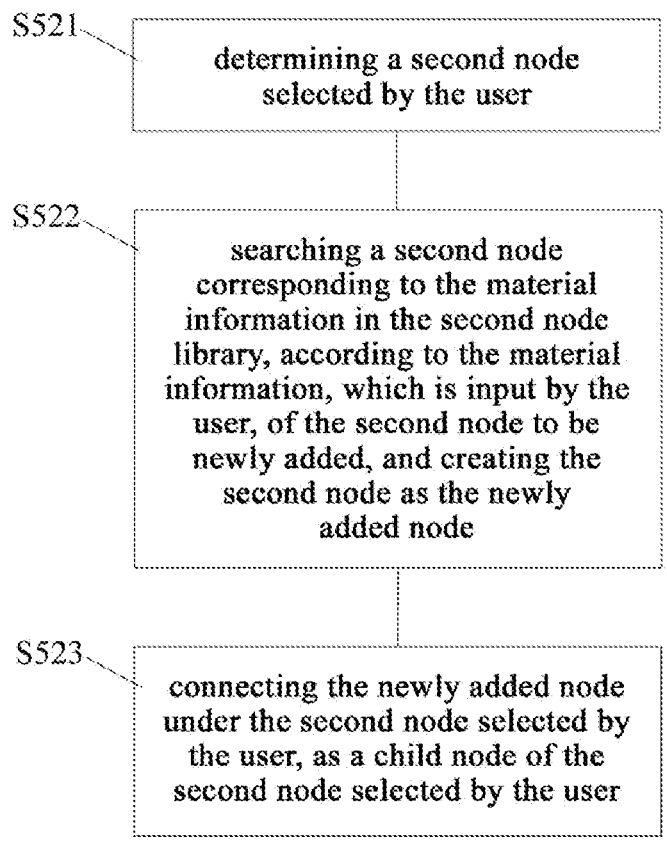
FIG. 8 is a flowchart of adding node(s) in the bill of material conversion method according to an embodiment of the present disclosure.

FIG. 8 is a flowchart of adding node(s) in the method for converting bills of material according to the embodiment of the present disclosure. Optionally, referring to FIG. 8, adding node(s) may specifically include the following steps S521 to S523:

S521, determining a second node selected by the user.

Specifically, if the user wants to add second node(s), one or more second nodes may be selected, and the newly added second nodes are stitched under the selected one or more second nodes, that is, as child nodes of the selected one or more second nodes.

S522, searching a second node corresponding to the material information in the second node library, according to the material information, which is input by the user, of the second node to be newly added, and creating the second node as the newly added node.

Specifically, after the user determines the second node to be newly added, the second node corresponding to the material information input by the user may be searched in the second node library according to the material information of the second node to be newly added, and the second node is created as a newly added node and stored in the list. If the corresponding material information is searched, the material information is converted into the material information of the second node to be newly added, thereby creating the newly added node, and the newly added node stored into the list Lf1; if the corresponding material information is not searched, the material information is firstly created, then the material information is converted into the material information of the second node to be newly added, so that the newly added node is created, and stored into the list Lf1.

S523, connecting the newly added node under the second node selected by the user, as a child node of the second node selected by the user.

Specifically, the newly added nodes are stitched under one or more second nodes selected by the user in S521, and the number of the newly added node is the number of the last second node in the list plus one when no node is added; and the parent node information of the newly added node is the number of the second node selected by the user; if there is a child node under the node position of the newly added node, the number of the child node is not changed, and the parent node information becomes the number of the newly added node. The changed attribute information of the second nodes are updated in the list.

Figure 9:
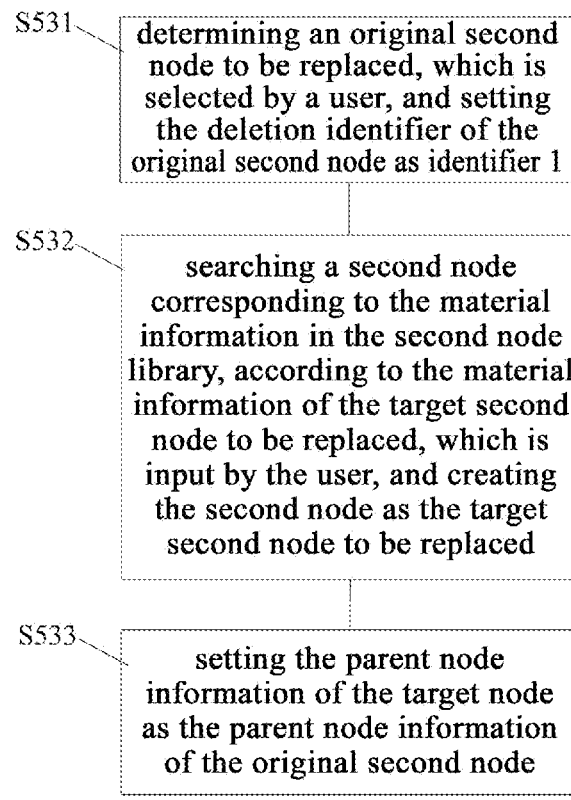
FIG. 9 is a flowchart of replacing node(s) in the bill of material conversion method according to an embodiment of the present disclosure.

FIG. 9 is a flowchart of replacing node(s) in the method for converting bills of material according to the embodiment of the present disclosure. Optionally, referring to FIG. 9, replacing node(s) may specifically include the following steps S531 to S533:

S531, determining an original second node to be replaced, which is selected by a user, and setting the deletion identifier of the original second node as identifier 1.

Specifically, the user may select one or more second nodes that the user wants to replace, obtain the numbers of the one or more second nodes selected by the user, and set the deletion identifier of the corresponding second node to identifier 1 according to the numbers (i.e., delete the corresponding second node).

S532, searching a second node corresponding to the material information in the second node library, according to the material information of the target second node to be replaced, which is input by the user, and creating the second node as the target second node to be replaced.

Specifically, after the user determines the target second node to be replaced, the second node corresponding to the material information input by the user may be searched in the second node library, according to the material information of the target second node, and after the original second node to be replaced, which is selected by the user, is deleted, the target second node is stitched at an original node position of the deleted original second node. If the corresponding material information is searched, the material information is converted into the material information of the target second node, so as to replace the node, and the replaced node stored into the list Lf1; if the corresponding material information is not searched, the material information is created, then the material information is converted into the material information of the target second node, so as to replace the node, and the replaced node stored into the list Lf1.

S533, setting the parent node information of the target node as the parent node information of the original second node.

Specifically, since a node position of the target second node is identical to the node position of the original second node, the parent node information of the target second node is identical to the parent node information of the original second node, and therefore, after the replacement of node is completed, the parent node information of the target node is set as the parent node information of the original second node. The number of the target node is the number of the last second node in the list plus one when the node is not replaced; if there is a child node under the node position of the target node, the number of the child node is not changed, and the parent node information becomes the number of the target node.

For the original second node, since it is replaced in the deletion manner, only the value of its deletion identifier is changed and not displayed, and the other attribute information of the original second node are not changed. The changed attribute information of the second nodes are updated in the list. Note that the original second node and its corresponding information are simply not displayed, but are still stored in the list.

After performing the fast clipping on the second BOM of the tree structure, according to the parent node information in the attribute information of each second node in the updated list, each second node in the list is converted into the second BOM of the clipped tree structure in a same manner as that in step S4, that is, the process of converting the first BOM into the second BOM is completed.

Figure 10:
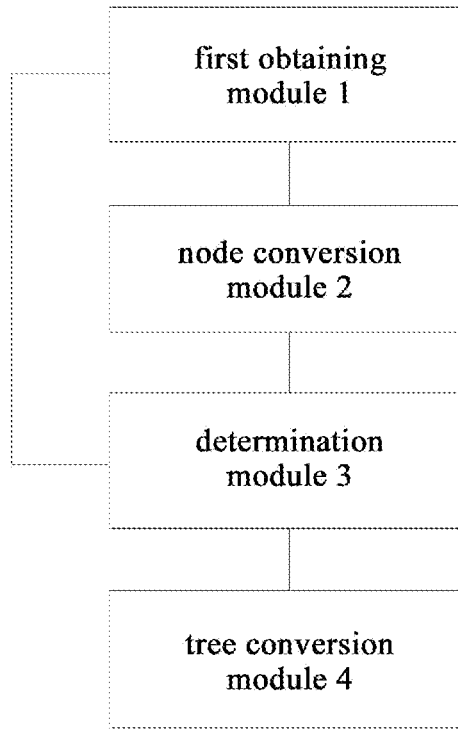
FIG. 10 is a schematic structural diagram of a bill of material conversion system according to an embodiment of the present disclosure.

FIG. 10 is a schematic structural diagram of a system for converting a bill of material according to an embodiment of the present disclosure. In a second aspect of the present disclosure, as shown in FIG. 10, an embodiment of the present disclosure further provides a bill of material conversion system, where the system includes:

a first obtaining module 1 configured to obtain an unprocessed first node in a first bill of material;

a node conversion module 2 configured to create a second node corresponding to a second bill of material according to the obtained first node, according to a preset correspondence, and store the created second node into a list; and a determination module 3 configured to determine whether the first node currently obtained is a last first node of the first bill of material.

If the first node currently obtained is not the last first node of the first bill of material, the result is returned to the first obtaining module 1, to obtain one of unprocessed first nodes in the first bill of material.

If the first node currently obtained is the last first node in the first BOM, the result is returned to a tree conversion module 4, wherein the tree conversion module 4 is configured to convert respective second nodes in the list into the second bill of material of a tree structure.

Optionally, in the system provided in this embodiment, the node conversion module 2 specifically includes:

a first module configured to search a second node corresponding to the number of the first node in a second node library according to the number of the obtained first node, and create the second node; and a second module configured to store the created second node into the list.

Optionally, in the system provided in this embodiment, the first obtaining module 1 is specifically configured to: obtain unprocessed first nodes in the first bill of material by using a breadth first search algorithm and a depth first search algorithm.

Optionally, in the system provided in this embodiment, the second node has the plurality of attribute information, and the plurality of attribute information includes a number, material information, parent node information, and a deletion identifier of the second node. The tree conversion module 4 specifically includes:

a traversing and determination module configured to circularly traverse each second node in the list, and sequentially obtain parent node information of each second node; determine whether the parent node information of the second node is null.

if the parent node information of the second node is not null, the result is returned to the first stitching module, wherein the first stitching module is configured to stitch second nodes with same parent node information as nodes in a same layer, and connect the second nodes with the same parent node information with the second node serving as a parent node of the nodes in the layer.

if the parent node information of the second node is null, the result is returned to the second stitching module, wherein the second stitching module is configured to create the second node as a root node of the second bill of material of the tree structure.

Optionally, in the system provided in this embodiment, the system further includes:

a fast clipping module configured to perform a fast clipping on the second bill of material of the tree structure by a user, and the fast clipping module includes a node deleting module, a node adding module and a node replacing module.

The node deleting module is specifically configured to:

determine a second node to be deleted, and set\ the deletion identifier of the second node to be deleted as identifier 1.

change the parent node information of all child nodes of the second node to be deleted to the parent node information of the second node to be deleted.

The node adding module is specifically configured to:

determine a second node selected by the user;

search a second node corresponding to material information in the second node library, according to the material information, which is input by the user, of the second node to be newly added, and create the second node as the newly added node;

connect the newly added node under the second node selected by the user, as a child node of the second node selected by the user.

The node replacing module is specifically configured to:

determine an original second node to be replaced, which is selected by a user, and set the deletion identifier of the original second node as identifier 1;

search a second node corresponding to material information in the second node library, according to the material information of a target second node to be replaced, which is input by the user, and create the second node as the target second node to be replaced;

set the parent node information of the target node as the parent node information of the original second node.

It may be understood that the product embodiments provided in the embodiments of the present disclosure correspond to the method embodiments described above, and specific contents may refer to the contents of each method embodiment, which are not described herein again.

In a third aspect of the present disclosure, an embodiment of the present disclosure provides an electronic apparatus, including: one or more processors; and a memory for storing executable instructions; the processor is coupled with the memory via a communication bus and is used for reading executable instructions from the memory so as to realize the BOM conversion method according to any one of the embodiments of the first aspect.

Figure 11:
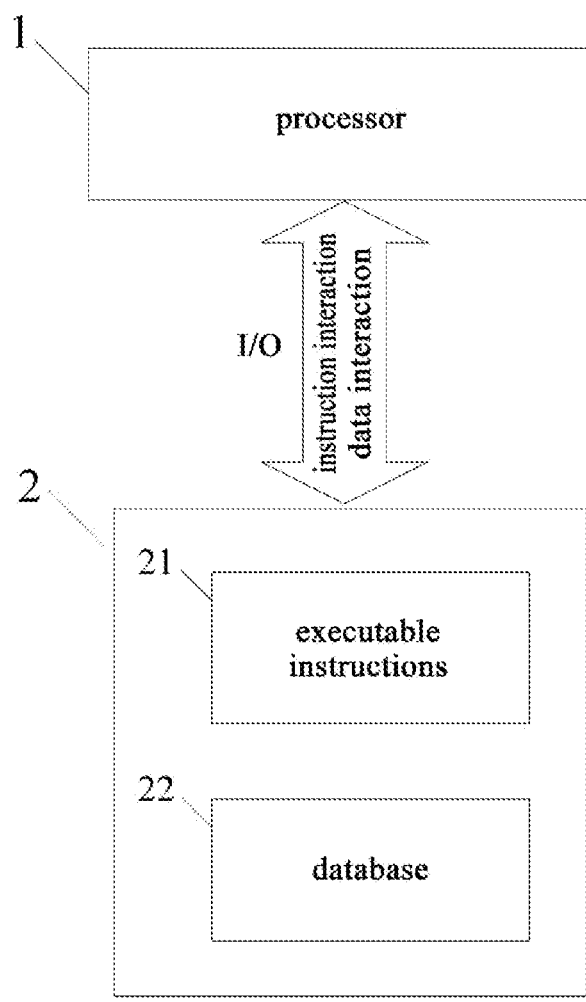
FIG. 11 is a schematic structural diagram of an electronic apparatus according to an embodiment of the present disclosure.

FIG. 11 is a schematic structural diagram of an electronic apparatus according to an embodiment of the present disclosure. Specifically, as shown in FIG. 11, taking the electronic apparatus including one processor 1 as an example, the memory 2 stores one or more executable instructions 21, and a user inputs data of the first BOM or an operation required to be performed on the first BOM into the electronic apparatus, so that the processor 1 and the memory 2 perform an instruction interaction with each other. The one or more executable instructions 21, when executed by the processor 1, cause the processor to implement the BOM conversion method according to any one of the embodiments of the first aspect. The node data in the BOM is stored in the database 22, for example, a list formed by the second nodes (e.g., the list Lf in FIG. 4) may be stored in the database 22. In converting the first BOM to the second BOM, the processor 1 perform a data interaction with the database 22 in the memory 2. After the BOM conversion is completed, the processor 1 calls the data of the second BOM in the memory 2, so that one or more executable instructions 21 are executed, and the data of the second BOM is output to the user. Also, the executable instructions 21 described above may include and/or correspond to one or more components of a PLM software application configured to generate and store product data in the database 22. Alternatively, the structure and the implementation process of the electronic apparatus are merely exemplary and not limited herein.

In a fourth aspect of the present disclosure, embodiments of the present disclosure provide a computer-readable storage medium, which stores computer-executable instructions thereon, and wherein the instructions, when executed by a processor, cause the processor to implement the BOM conversion method according to any one of the embodiments of the first aspect.

Figure 12:
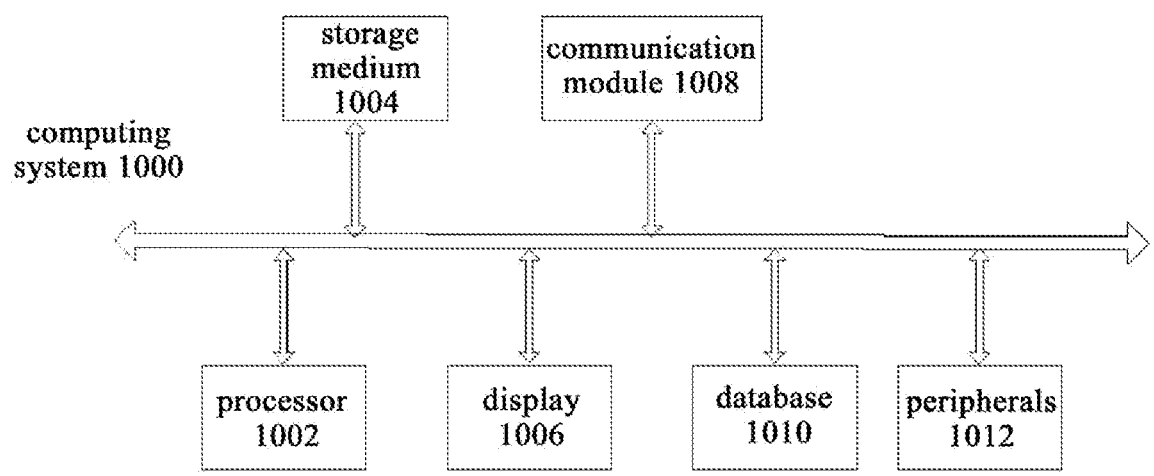
FIG. 12 is a block diagram of an exemplary computing system according to an embodiment of the present disclosure.

The bill of material conversion method provided by the present disclosure may be implemented on any suitable computing system platform. FIG. 12 is a block diagram of an exemplary computing system according to an embodiment of the present disclosure.

The exemplary computing system 1000 may include any appropriate type of TV, such as a plasma TV, a liquid crystal display (LCD) TV, a touch screen TV, a projection TV, a non-smart TV, a smart TV, etc. The exemplary computing system 1000 may also include other computing systems, such as a personal computer (PC), a tablet or mobile computer, or a smart phone, etc. In addition, the exemplary computing system 1000 may be any appropriate content-presentation device capable of presenting any appropriate content. Users may interact with the computing system 100 to perform other activities of interest.

As shown in FIG. 12, computing system 100 may include a processor 1002, a storage medium 1004, a display 1006, a communication module 1008, a database 1010 and peripherals 1012. Certain devices may be omitted and other devices may be included to better describe the relevant embodiments.

The processor 1002 may include any appropriate processor or processors. Further, the processor 1002 may include multiple cores for multi-thread or parallel processing. The processor 1002 may execute sequences of computer program instructions to perform various processes. The storage medium 1004 may include memory modules, such as ROM, RAM, flash memory modules, and mass storages, such as CD-ROM and hard disk, etc. The storage medium 1004 may store computer programs for implementing various processes when the computer programs are executed by the processor 1002. For example, the storage medium 1004 may store computer programs for implementing various algorithms (such as an image processing algorithm) when the computer programs are executed by the processor 1002.

Further, the communication module 1008 may include certain network interface devices for establishing connections through communication networks, such as TV cable network, wireless network, internet, etc. The database 1010 may include one or more databases for storing certain data and for performing certain operations on the stored data, such as database searching.

The display 1006 may provide information to users. The display 1006 may include any appropriate type of computer display device or electronic apparatus display such as LCD or OLED based devices. The peripherals 112 may include various sensors and other I/O devices, such as keyboard and mouse.

It will be understood by one of ordinary skill in the art that all or some of steps of the method, functional modules/units in the system and the device disclosed above may be implemented as software, firmware, hardware, or suitable combinations thereof. In a hardware implementation, a division among functional modules/units mentioned in the above description does not necessarily correspond to the division among physical components. For example, one physical component may have a plurality of functions, or one function or step may be performed by several physical components in cooperation. Some or all of the physical components may be implemented as software executed by a processor, such as a central processing unit, a digital signal processor, or a microprocessor, or as hardware, or as an integrated circuit, such as an application specific integrated circuit. Such software may be distributed on a computer-readable storage medium, which may include a computer storage medium (or a non-transitory medium) and a communication medium (or a transitory medium). The term computer storage medium includes volatile and nonvolatile, removable and non-removable media implemented in any method or technology for storage of information, such as computer readable instructions, data structures, program modules or other data, as is well known to one of ordinary skill in the art. A computer storage medium includes, but is not limited to, RAM, ROM, EEPROM, flash memory or other memory technology, CD-ROM, Digital Versatile Disk (DVD) or other optical disk storage, magnetic cassette, magnetic tape, magnetic disk storage or other magnetic storage device, or any other medium which may be used to store desired information and which may accessed by a computer. In addition, a communication medium typically embodies computer readable instructions, data structures, program modules or other data in a modulated data signal such as a carrier wave or other transport mechanism, and includes any information delivery medium, as is well known to one of ordinary skill in the art.

The flowchart and block diagrams in the drawings illustrate architecture, functionality, and operation of possible implementations of a device, a method and a computer program product according to various embodiments of the present disclosure. In this regard, each block in the flowchart or block diagrams may represent a module, program segment(s), or a portion of a code, which includes at least one executable instruction for implementing specified logical function(s). It should also be noted that, in some alternative implementations, functions noted in the blocks may occur out of the order noted in the drawings. For example, two blocks being successively connected may, in fact, be performed substantially concurrently, or the blocks may sometimes be performed in the reverse order, depending upon the functionality involved. It will also be noted that each block of the block diagrams and/or flowchart, and combinations of blocks in the block diagrams and/or flowchart, may be implemented by special purpose hardware-based systems that perform the specified functions or operations, or combinations of special purpose hardware and computer instructions.

In summary, in the BOM conversion method according to embodiments of the present disclosure, the first nodes in a first bill of material are sequentially obtained, and second nodes corresponding to a second bill of material are created according to the first nodes, according to a preset relationship; after all the second nodes are created, the second nodes are converted into the second bill of material of the tree structure, so that an automatic conversion of the first bill of material into the second bill of material may be achieved, saving time spent on conversion of different bills of material, and improving conversion efficiency of the bill of material.

It should be understood that the above embodiments are merely exemplary embodiments for explaining the principles of the present disclosure, and the present disclosure is not limited thereto. It will be apparent to one of ordinary skill in the art that various changes and modifications may be made therein without departing from the spirit and essence of the present disclosure, and these changes and modifications are to be considered as falling within the scope of the present disclosure.

What is claimed is:

1. A bill of material conversion method for converting a bill of material of a product in manufacturing industry to convert a first bill of material to a second bill of material as a target bill of material, comprising steps S1 to S4:
   Step S1: obtaining an unprocessed first node in the first bill of material of a tree structure having first nodes;
   Step S2: according to a preset correspondence, creating a second node corresponding to the second bill of material of a tree structure having second nodes according to the obtained first node, and storing the created second node into a list;
   Step S3: determining whether the first node currently obtained is a last first node of the first bill of material;
   in response to the first node currently obtained being not the last first node of the first bill of material, repeatedly performing steps S1 through S3;
   in response to the first node currently obtained being the last first node of the first bill of material, performing step S4: converting respective second nodes in the list into the second bill of material; and
   the first nodes and the second nodes have a plurality of attribute information, comprising a number of a node,
   the step S2 comprises:
   according to the number of the obtained first node, creating the second node by searching the second node corresponding to the number of the first node in a second node library corresponding to a factory selected by a user to manufacture the product; and
   storing the created second node into the list,
   wherein the number of each of the second nodes, and a correspondence between the number and the second node are stored in a database in advance, and a set of the number of each of the second nodes and the correspondence between the number and the second node in the database is the second node library.

2. The method of claim 1, wherein the step S1 comprises:
   obtaining the unprocessed first node in the first bill of material by using a breadth first search algorithm and a depth first search algorithm.

3. The method of claim 1, wherein the plurality of attribute information further comprises material information, parent node information, and a deletion identifier of a node.

4. The method of claim 3, wherein the step S4 comprises:
   circularly traversing each second node in the list, and sequentially obtaining parent node information of the second node;
   determining whether the parent node information of the second node is null;

in response to the parent node information of the second node being not null, stitching second nodes with same parent node information as nodes in a same layer, and connecting the second nodes with the same parent node information with a second node serving as a parent node of the nodes in the same layer;

in response to the parent node information of the second node being null, creating the second node as a root node of the second bill of material.

5. The method of claim 4, further comprising:

performing a fast clipping on the second bill of material, by a user, wherein the fast clipping comprises at least one of deleting a node, adding a node, and replacing a node;

the deleting a node comprises:

determining a second node to be deleted, and setting the deletion identifier of the second node to be deleted as a first identifier;

changing the parent node information of all child nodes of the second node to be deleted to the parent node information of the second node to be deleted;

the adding a node comprises:

determining a second node selected by the user;

searching a second node corresponding to material information in the second node library, according to the material information, which is input by the user, of the second node to be newly added, and creating the second node as the newly added node;

connecting the newly added node under the second node selected by the user, as a child node of the second node selected by the user;

the replacing a node comprises:

determining an original second node to be replaced, which is selected by a user, and setting the deletion identifier of the original second node as the first identifier;

searching a second node corresponding to material information in the second node library, according to the material information of a target second node to be replaced, which is input by the user, and creating the second node as the target second node to be replaced;

setting the parent node information of the target node as the parent node information of the original second node.

6. An electronic apparatus for converting a bill of material of a product in manufacturing industry to convert a first bill of material to a second bill of material as a target bill of material, comprising a processor and a memory for storing executable instructions; wherein the processor is coupled to the memory through a communication bus, and is configured to read the executable instructions from the memory to perform the following steps S1 to S4:

Step S1: obtaining an unprocessed first node in the first bill of material of a tree structure having first nodes;

Step S2: according to a preset correspondence, creating a second node corresponding to the second bill of material of a tree structure having second nodes according to the obtained first node, and storing the created second node into a list;

Step S3: determining whether the first node currently obtained is a last first node of the first bill of material;

in response to the first node currently obtained being not the last first node of the first bill of material, repeatedly performing steps S1 through S3;

in response to the first node currently obtained being the last first node of the first bill of material, performing step S4: converting respective second nodes in the list into the second bill of material; and the first nodes and the second nodes have a plurality of attribute information, comprising a number of a node, the step S2 comprises:

according to the number of the obtained first node, creating the second node by searching the second node corresponding to the number of the first node in a second node library corresponding to a factory selected by a user to manufacture the product; and storing the created second node into the list, wherein the number of each of the second nodes, and a correspondence between the number and the second node are stored in a database in advance, and a set of the number of each of the second nodes and the correspondence between the number and the second node in the database is the second node library.

7. The electronic apparatus of claim 6, wherein the step S1 comprises:

obtaining the unprocessed first node in the first bill of material by using a breadth first search algorithm and a depth first search algorithm.

8. The electronic apparatus of claim 6, wherein the plurality of attribute information further comprises material information, parent node information, and a deletion identifier of a node.

9. The electronic apparatus of claim 8, wherein the step S4 comprises:

circularly traversing each second node in the list, and sequentially obtaining parent node information of the second node;

determining whether the parent node information of the second node is null;

in response to the parent node information of the second node being not null, stitching second nodes with same parent node information as nodes in a same layer, and connecting the second nodes with the same parent node information with a second node, associated with the parent node information, serving as a parent node of the nodes in the same layer;

in response to the parent node information of the second node being null, creating the second node as a root node of the second bill of material.

10. The electronic apparatus of claim 9, wherein the processor is further configured to read the executable instructions from the memory to perform the following steps:

performing a fast clipping on the second bill of material, by a user, wherein the fast clipping comprises at least one of deleting a node, adding a node, and replacing a node;

the deleting a node comprises:

determining a second node to be deleted, and setting the deletion identifiers of the second node to be deleted as a first identifier;

changing the parent node information of all child nodes of the second node to be deleted to the parent node information of the second node to be deleted;

the adding a node comprises:

determining a second node selected by the user;

searching a second node corresponding to material information in the second node library, according to the material information, which is input by the user, of the second node to be newly added, and creating the second node as the newly added node;

connecting the newly added node under the second node selected by the user, as a child node of the second node selected by the user;

the replacing a node comprises:

determining an original second node to be replaced, which is selected by a user, and setting the deletion identifier of the original second node as the first identifier;

searching a second node corresponding to material information in the second node library, according to the material information of a target second node to be replaced, which is input by the user, and creating the second node as the target second node to be replaced;

setting the parent node information of the target node as the parent node information of the original second node.

11. A non-transitory computer-readable storage medium having stored thereon computer-executable instructions for converting a bill of material of a product in manufacturing industry to convert a first bill of material to a second bill of material as a target bill of material, wherein the instructions, when executed by a processor, cause the processor to perform the following steps S1 to S4:

Step S1: obtaining an unprocessed first node in the first bill of material of a tree structure having first nodes;

Step S2: according to a preset correspondence, creating a second node corresponding to the second bill of material of a tree structure having second nodes according to the obtained first node, and storing the created second node into a list;

Step S3: determining whether the first node currently obtained is a last first node of the first bill of material;

in response to the first node currently obtained being not the last first node of the first bill of material, repeatedly performing steps S1 through S3;

in response to the first node currently obtained being the last first node of the first bill of material, performing step S4: converting respective second nodes in the list into the second bill of material, and the first nodes and the second nodes have a plurality of attribute information, comprising a number of a node, the step S2 comprises:

according to the number of the obtained first node, creating the second node by searching the second node corresponding to the number of the first node in a second node library corresponding to a factory selected by a user to manufacture the product; and storing the created second node into the list, wherein the number of each of the second nodes, and a correspondence between the number and the second node are stored in a database in advance, and a set of the number of each of the second nodes and the correspondence between the number and the second node in the database is the second node library.

12. The non-transitory computer-readable storage medium of claim 11, wherein the plurality of attribute information further comprises material information, parent node information, and a deletion identifier of a node.

13. The non-transitory computer-readable storage medium of claim 12, wherein the step S4 comprises:

circularly traversing each second node in the list, and sequentially obtaining parent node information of the second node;

determining whether the parent node information of the second node is null;

in response to the parent node information of the second node being not null, stitching second nodes with same parent node information as nodes in a same layer, and connecting the second nodes with the same parent node information with a second node serving as a parent node of the nodes in the same layer;

in response to the parent node information of the second node being null, creating the second node as a root node of the second bill of material.

14. The non-transitory computer-readable storage medium of claim 13, wherein the computer-executable instructions stored on the non-transitory computer-readable storage medium, when executed by a processor, further cause the processor to perform the following steps:

performing a fast clipping on the second bill of material, by a user, wherein the fast clipping comprises at least one of deleting a node, adding a node, and replacing a node;

the deleting a node comprises:

determining a second node to be deleted, and setting the deletion identifiers of the second node to be deleted as a first identifier;

changing the parent node information of all child nodes of the second node to be deleted to the parent node information of the second node to be deleted;

the adding a node comprises:

determining a second node selected by the user;

searching a second node corresponding to material information in the second node library, according to the material information, which is input by the user, of the second node to be newly added, and creating the second node as the newly added node;

connecting the newly added node under the second node selected by the user, as a child node of the second node selected by the user;

the replacing a node comprises:

determining an original second node to be replaced, which is selected by a user, and setting the deletion identifier of the original second node as the first identifier;

searching a second node corresponding to material information in the second node library, according to the material information of a target second node to be replaced, which is input by the user, and creating the second node as the target second node to be replaced;

setting the parent node information of the target node as the parent node information of the original second node.

* * * * *